United States Patent
Ghosh et al.

(10) Patent No.: US 7,450,668 B2
(45) Date of Patent: Nov. 11, 2008

(54) SOFT BIT VITERBI EQUALIZER USING PARTIALLY COLLAPSED METRICS

(75) Inventors: Arunabha Ghosh, Austin, TX (US); Richard A. Kobylinski, Austin, TX (US)

(73) Assignee: AT&T Intellectual Property I, L.P., Reno, NV (US)

( * ) Notice: Subject to any disclaimer, the term of this patent is extended or adjusted under 35 U.S.C. 154(b) by 536 days.

(21) Appl. No.: 11/049,370

(22) Filed: Feb. 2, 2005

(65) Prior Publication Data

US 2006/0171489 A1    Aug. 3, 2006

(51) Int. Cl.
H04L 27/06 (2006.01)
H03M 13/03 (2006.01)

(52) U.S. Cl. .................................. 375/341; 714/795

(58) Field of Classification Search ................. 375/316, 375/340, 341, 259–262; 714/699, 746, 786, 714/792, 794, 795; 704/200, 231, 236, 242
See application file for complete search history.

(56) References Cited

U.S. PATENT DOCUMENTS

| | | | | |
|---|---|---|---|---|
| 5,185,747 A | * | 2/1993 | Farahati | 714/795 |
| 5,208,816 A | * | 5/1993 | Seshardi et al. | 714/795 |
| 6,625,236 B1 | * | 9/2003 | Dent et al. | 375/341 |
| 2002/0122510 A1 | * | 9/2002 | Yakhnich et al. | 375/342 |
| 2003/0115540 A1 | * | 6/2003 | Bae et al. | 714/792 |
| 2005/0149838 A1 | * | 7/2005 | Chiueh et al. | 714/795 |

* cited by examiner

*Primary Examiner*—Mohammad H Ghayour
*Assistant Examiner*—Vineeta S Panwalkar
(74) *Attorney, Agent, or Firm*—Toler Law Group

(57) ABSTRACT

First and second partially collapsed metric values are determined for each bit in a symbol transition. Each first partially collapsed metric value is a cumulative metric of starting in a first state and ending in a second state in L transitions with the respective bit in the symbol transition being a first value. Each second partially collapsed metric value is a cumulative metric of starting in the first state and ending in the second state in L transitions with the respective bit in the symbol transition being a second value, the second value differing from the first value. For each bit in the symbol transition, a relative likelihood value is determined based on its respective first and second partially collapsed metric values. A symbol is decoded based on a hard decision performed using the relative likelihood value for each bit in the symbol transition.

15 Claims, 5 Drawing Sheets

SOFT BIT VITERBI EQUALIZER USING PARTIALLY COLLAPSED METRICS

FIELD OF THE DISCLOSURE

The present disclosure relates to Viterbi equalizers.

BACKGROUND

A fundamental challenge in wireless communication is the unreliable and hostile nature of wireless channels. A problematic wireless channel distorts and corrupts a transmitted signal to such a degree that it is may be virtually unrecognizable at a receiver. This is especially true when a line of sight (LOS) condition is not achieved and the signal reaches the receiver after multiple reflections and scatterings. The dispersive nature of the wireless channel also creates inter-symbol interference (ISI), which cannot be mitigated by changing RF system parameters such as frequency plan, transmit power and antenna pattern.

ISI occurs in an 8-PSK (8-state Phase Shift Keying) mode of EDGE (Enhanced Data for GSM Evolution) not only due to the dispersive nature of the channel, but also due to a transmit filter. An EDGE transmit filter restricts a signal's bandwidth to approximately 200 kHz to ensure compatibility with a spectral mask previously defined for GMSK (Gaussian Minimum Shift Keying) transmission. An ISI-free Nyquist filter in the case of EDGE would lead to a signal with a 271 kHz bandwidth commensurate with the symbol rate of EDGE/GSM (Global System for Mobile communication). However, since the 8-PSK transmission is restrained to the 200 kHz bandwidth, Nyquist's ISI free sampling criteria is violated. This results in a transmission with ISI even in a non-dispersive channel when LOS is achieved.

The ISI contained within the corrupted signal can be partially mitigated by passing the signal through an equalizer such as a Linear Equalizer or a Decision Feedback Equalizer (DFE). However, neither the linear equalizer nor the DFE are optimal in terms of minimizing the symbol error rate.

A non-linear equalizer such as a Maximum Likelihood Sequence Estimator (MLSE) based on the Viterbi Algorithm (VA) is considered to be optimal, and results in the smallest error rate for a linear dispersive channel, such as the wireless channel, or a channel associated with a twisted-pair copper wire. A drawback of the MLSE is the complexity of the VA, which increases exponentially with the equalization depth and the constellation size of the modulation. In the case of a typical urban environment, the dispersive nature of the channel requires an equalization over 3 to 4 symbols which corresponds to a delay spread of 11 to 14 seconds. The number of states associated with the VA in the MLSE is 8 to 16 states for GMSK modulation and 512 to 4096 states for 8-PSK modulation. The sheer large number of states required in the case of 8-PSK modulation makes the use of MLSE computationally difficult or prohibitive.

Alternative equalizer structures such as Delayed Decision Feedback Sequence Estimator (DDFSE) and Reduced State Sequence Estimator (RSSE) have been shown to have near optimal performance with a manageable level of complexity. In the case of DDFSE, a tradeoff between complexity and performance can be achieved by truncating the depth of equalization with decision feedback ISI cancellation. RSSE allows for an even finer tradeoff between the complexity and performance by using set partitioning in which one or more modulation symbols are mapped onto a partition. It has been shown that both DDFSE and RSSE can achieve a reasonably close performance (e.g. 0.5 to 1.0 dB) in terms of Bit Error Rate (BER) when compared to the optimum MLSE equalizer.

To improve the performance of the forward error correction (FEC) at the receiver, soft likelihood values are provided to the decoder instead of hard bit decisions. The bit-wise soft log-likelihood value is defined as:

$$L = \log_{10}\left[\frac{Pr\{b=+1\}}{Pr\{b=-1\}}\right] \qquad (1)$$

where $Pr\{b=+1\}$ is the probability of a bit being equal to +1, and $Pr\{b=-1\}$ is the probability of a bit being equal to −1. Although the generation of likelihood values requires extra computational complexity, the performance benefits in terms of frame error rate (FER) or block error rate (BLER) are considerable. Unlike hard decisions, which are derived from a trellis with a minimum metric, soft likelihood estimation requires a comparison of the trellis with minimum metric to other trellises with larger metrics. Optimum soft likelihood information is produced by symbol-by-symbol, maximum a-posteriori (MAP) decoding algorithms. However, less computationally intensive algorithms such as Soft Output Viterbi Algorithm (SOVA) are used more commonly for MLSE equalizers.

A challenge in the implementation of RSSE-based equalizers is the generation of the soft likelihood values. In a RSSE, some of the non-surviving trellises required for the calculation of the soft likelihood value are missing. This poses a hurdle for implementing a RRSE equalizer for EDGE systems with an acceptable degree of performance. In a recent study, an RSSE-based equalizer for EDGE was proposed with soft symbol and soft bit estimation based on partial re-growing of the trellises. This algorithm looks at the existence of the non-detected path metric for a given bit value, if the non-detected path is missing. The missing branch metric and thus the corresponding path metric are calculated from a state history. The re-growing process adds computational complexity but the overall complexity of the algorithm is far less than for MLSE.

Existing RSSEs have a soft decision performance that is relatively poorer than their hard decision performance. This effect becomes more prominent as the modulation alphabet size increases or as the number of states in the equalizer decreases.

BRIEF DESCRIPTION OF THE DRAWINGS

The present invention is pointed out with particularity in the appended claims. However, other features are described in the following detailed description in conjunction with the accompanying drawings in which:

DETAILED DESCRIPTION OF THE DRAWINGS

Disclosed herein are embodiments of a Soft Bit Viterbi Equalizer (SBVE) based on an RSSE that produces soft bit values with relatively less overhead in terms of computational complexity. The SBVE is a variant of the Viterbi Algorithm that uses partially collapsed and completely collapsed bidirectional cumulative metrics to improve the soft decision performance. Simulation results show a significant reduction in the overall block error rate resulting from an improved accuracy of the soft decisions.

An implementation of the SBVE is presented for 8-PSK modulation due to its applicability in EDGE receivers. However, the SBVE can be used for any modulation scheme which can be partitioned based on an Ungerboeck Partitioning Tree. For example, the SBVE can be adapted to modulation schemes such as QPSK or 16 QAM.

Figure 1:
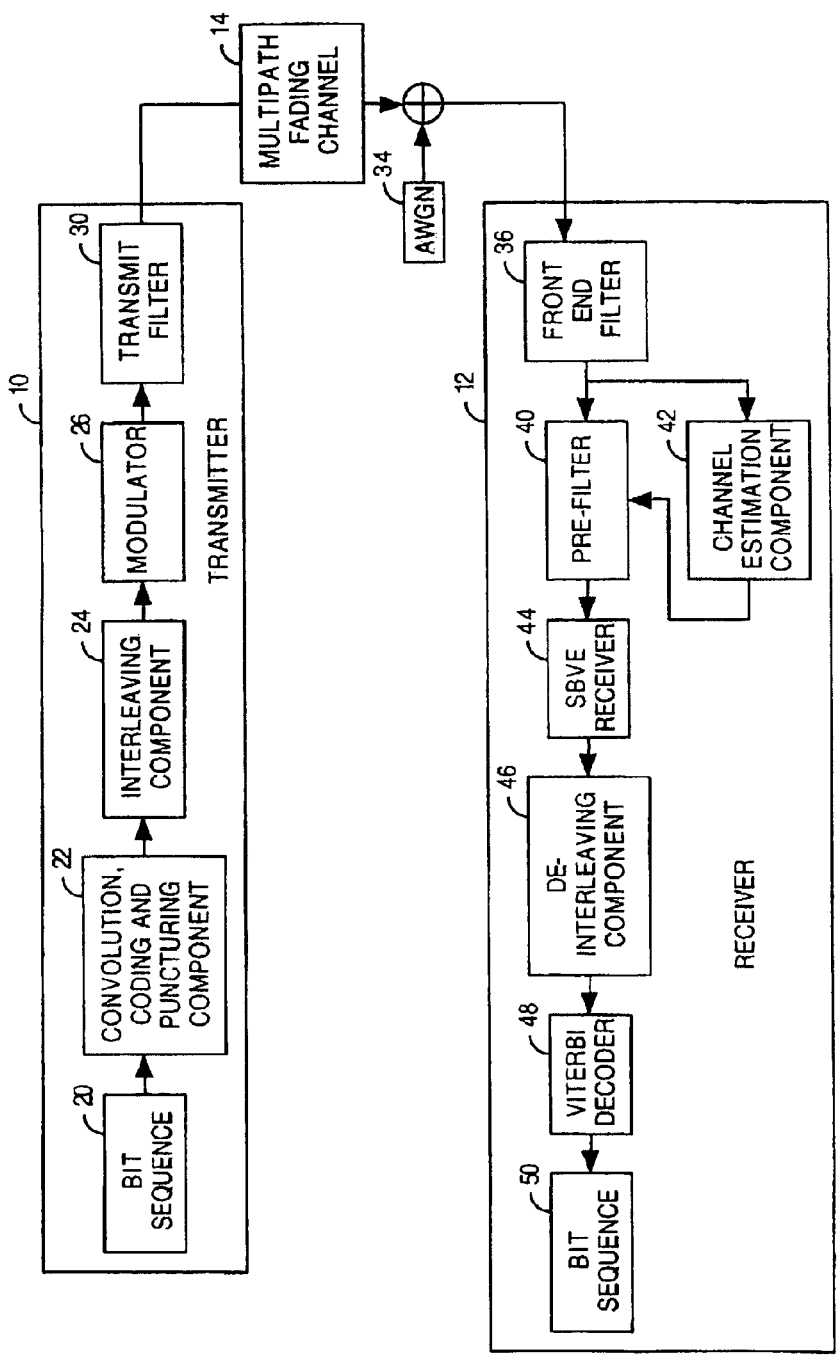
FIG. 1 is a block diagram of a baseband equivalent model of an EDGE telecommunication system.

FIG. 1 is a block diagram of a baseband equivalent model of an EDGE telecommunication system. The telecommunication system comprises a transmitter 10 that communicates with a receiver 12 over a communication channel 14. In one embodiment, the communication channel 14 comprises a wireless channel modeled solely in the baseband domain by the Typical Urban (TU) channel model as defined by the European Telecommunications Standards Institute (ETSI).

An information bit sequence 20 to be transmitted is processed by a convolution, coding and puncturing component 22 of the transmitter 10. Using the convolution, coding and puncturing component 22, the information bit sequence 20 is coded using a rate ⅓ convolutional encoder and punctured to achieve an overall coding rate of an appropriate modulation and coding scheme (MCS). A choice of MCS is made by a Radio Link Control (RLC) at the transmitter 10 based on measurement feedback from the receiver 12.

The resulting coded sequence is interleaved by an interleaving component 24. The resulting coded and interleaved sequence is modulated by a modulator 26. In one embodiment, the modulator 26 comprises an 8-PSK modulator that maps the coded and interleaved sequence to an 8-PSK constellation based on the mapping shown in FIG. 2. The mapping is grey coded to achieve a reduced symbol error rate.

The resulting 8-PSK symbols are passed through a transmit filter 30 before being transmitted. The transmit filter 30 is designed such that the 8-PSK signal has the same transmit spectral mask as the GMSK signal. As mentioned previously, the transmit filter 30 does not fulfill Nyquist's ISI free sampling criteria and as a result introduces some ISI in the transmitted signal.

The transmitter 10 outputs the filtered signal to the communication channel 14. The filtered signal passes through a multipath, frequency-selective fading channel 32 which models the effect of multiple scattering in a wireless environment. For the purposes of illustration and example, the channel 32 is modeled as a typical urban (TU) multipath channel to emulate a typical urban fading environment. Additive white Gaussian noise (AWGN) 34 is added to the signal to model environmental noise in the communication channel 14 and/or noise in the receiver 12.

The receiver 12 receives the signal via the communication channel 14. The receiver 12 includes a front-end filter 36 to process the signal from the communication channel 14. In one embodiment, the front-end filter 36 comprises a root-raised cosine, low-pass filter with a 0.25 roll-off. The filtered signal is sampled once every symbol to generate discrete time samples thereof. The discrete time samples of the received signal (post-front-end filter 36) can be related to the transmitted signal (pre-transmit filter 30) and an overall channel impulse response as $$x_n = \sum_{l=0}^{L} h_l s_{n-l} + w_n \tag{2}$$

where x represents the discrete time representation of the received symbols (post-front-end filter 36), s represents the discrete time representation of the transmitted symbols (pre-transmit filter 10), h represents the discrete time representation of the channel impulse response, and w represents the discrete time representation of the AWGN noise 34.

The channel impulse response h includes the impulse response of the transmit filter 30, the receive filter 36, and the multipath fading channel 14. The received signal (post-front-end filter 36) is passed through a pre-filter 40 that makes the overall impulse response of the system minimum phase. The transform of the channel impulse response H(z) can be represented in terms of its minimum phase equivalent and all-pass equivalent as $$H(z) = H_{min}(z) H_{ap}(z) \tag{3}$$

where $H_{min}$ and $H_{ap}$ are the minimum phase and all-pass equivalents respectively. The pre-filter 40 is directed by a channel estimation component 42 to have an impulse response that is the inverse of $H_{ap}$. This makes the overall channel response after the pre-filter 40 as $$H_{eff}(z) = H(z) H_{ap}^{-1}(z) = H_{min}(z). \tag{4}$$

Since the partial energy of the minimum phase equivalent is highest, the effective channel response is such that most of the energy is in the leading taps, which improves the performance of the RSSE.

In a MLSE, the state of the system is defined based on the K previous symbols $[x_{n-1}, x_{n-2}, \ldots, x_{n-K}]$ where the number of states is given by the number of possible modulation symbols raised to the $K^{th}$ power. To reduce the number of states in an overall analysis of an RSSE, each symbol of the modulation constellation is mapped onto non-overlapping sets $\alpha_{i,k}$ where i indicates a set to which the symbol belongs and k denotes a tap index. This two dimensional set partitioning allows for different set partitioning for different tap indices. Thus, in an RSSE, the state of the system is defined by the previous K sets $[\alpha a_{n-1}, \alpha_{n-2}, \ldots, \alpha_{n-K}]$.

Unlike an MLSE, an RSSE can have multiple, parallel transitions which lead from one state to the next. While determining the surviving trellis, at first, only the state transition with the minimum branch metric is selected amongst the parallel transitions. Then amongst different trellises, the trellis with the minimum cumulative metric is selected as the survivor coming into each state. Once the states have been defined in this manner, a traditional Viterbi Algorithm is applied to estimate the most likely sequence.

Figure 2:
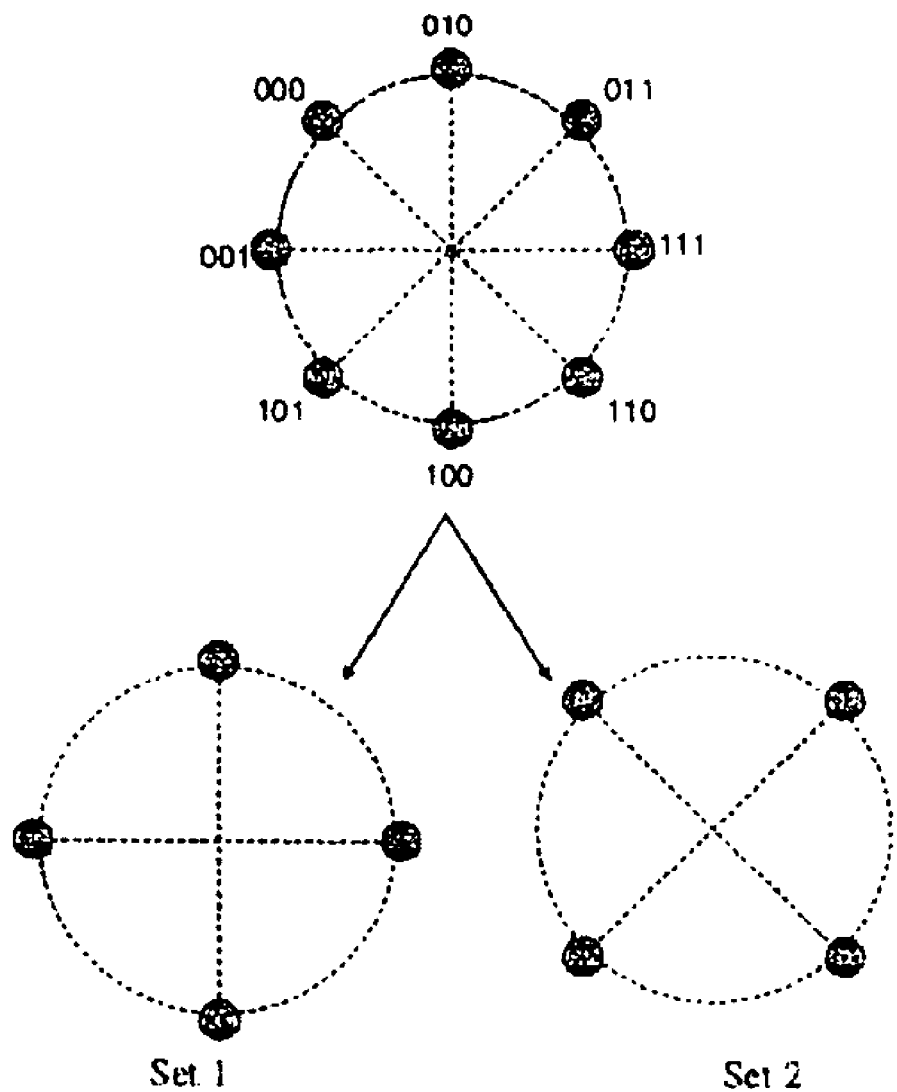
FIG. 2 is a diagram of an embodiment of a mapping of a coded and interleaved sequence to an 8-PSK constellation.

As an example, FIG. 2 shows a possible set partitioning for 8-PSK modulation. The eight symbols are partitioned into two non-overlapping sets. Thus, the number of the states in the system is reduced to $2^K$ in the RSSE compared to $8^K$ for the MLSE.

In the exemplary case of producing a minimum phase CIR, the pre-filter 40 acts to minimize a symbol error rate in an RSSE. To achieve the minimum phase equivalent, the pre-filter 40 comprises a recursive filter which is the inverse of the all-pass component of the CIR as described in equation (4).

The overall CIR H(z), being FIR (i.e. having a finite number of roots), can be written as a product of two finite polynomials $$H(z) = H_1(z)H_2(z) = H_1(z)H_2(z^{-1})\frac{H_2(z)}{H_2(z^{-1})} \quad (5)$$

where $H_1(z)$ has all the roots inside the unit circle and $H_2(z)$ has all the roots outside the unit circle. Based on this definition, the minimum phase and all-pass components are given by the following equations, respectively.

$$H_{\min}(z) = H_1(z)H_2(z^{-1}) \quad (6)$$

$$H_{ap}(z) = \frac{H_2(z)}{H_2(z^{-1})}$$

An appropriate impulse response of the pre-filter 40 in this case would be the inverse of the all-pass equivalent, which is given by:

$$H_{prefilter}(z) = \frac{H_2(z^{-1})}{H_2(z)}. \quad (7)$$

However, a causal implementation of the filter, which can be achieved by a recursive filter, is unstable since its poles are outside the unit circle. This problem can be mitigated by viewing the pre-filter function as non-causal, in which case the pre-filter 40 is stable. The received signal is time-reversed and passed through the pre-filter 40 having a response of $H_{prefilter}(1/z)$, which is non-causal but stable. This act results in an output is given by:

$$\gamma(z) = H_{prefilter}(1/z)X(1/z) \quad (8)$$

where X represents the received signal before the pre-filter 40 and $\gamma$ is the non-causal output of the pre-filter 40. Performing another time-reversal of the output of the pre-filter 40 results in a causal representation of the pre-filter output, Y, given by:

$$Y(z) = \gamma(1/z) = H_{prefilter}(z)X(z). \quad (9)$$

From the perspective of the RSSE, the output of the pre-filter 40 can be written as:

$$y_n = \sum_{l=0}^{L} h'_l s_{n-l} + v_n \quad (10)$$

where $h_1'$ is equal to the convolution of $h_1$ with the impulse response of the pre-filter 40, $h_{prefilter}$. Without loss of generality, h' is replaced by h hereinafter.

In a hard decision equalizer, the sequence of transmitted symbols is estimated such that the a-posteriori probability is maximized for the received sequence of symbols. Thus, the transmitted sequence is estimated to satisfy $$\max_{\hat{s}} P\{[\hat{s}_0, \hat{s}_1, \dots \hat{s}_{N-1}] \mid [y_0, y_1, \dots y_{N-1}]\} \quad (11)$$

where $\hat{s}_i$ is an estimated transmit sequence and $y_i$ is a received sequence. For a signal source with equally likely symbols, maximizing the a-posteriori probability is equivalent to maximizing the likelihood function, which is given by:

$$P\{[y_0, y_1, \dots y_{N-1}] \mid [\hat{s}_0, \hat{s}_1, \dots \hat{s}_{N-1}]\} = \quad (12)$$

$$\frac{1}{\sigma\sqrt{2\pi}} \prod_{n=0}^{N-1} e^{-\frac{1}{2\sigma^2}(y_n - \sum_{l=0}^{L} h_l \hat{s}_{n-l})^2}$$

The Viterbi Algorithm provides an efficient and optimum technique for estimating the transmitted sequence based on the maximization of the likelihood function given in equation (12). If the memory order of the channel is denoted by L, the effect of each symbol is persistent over the current symbol and the next L symbols as seen at the receiver. Thus in order to estimate the likelihood ratio of a bit as defined by equation (1), the current and next L symbols are considered. This procedure is repeated for each of the M bits that are used in creating a symbol. In the case of 8-PSK modulation, the estimation of the likelihood ratio is performed for each of the three bits.

To simplify notation of the algorithm, the branch metric for the $n^{th}$ transition between the states $\Omega_{n-1}$ and $\Omega_n$ is denoted as $$\gamma(n, \Omega_{n-1}, \Omega_n, m) = \left(y_n - h_0 e_m - \sum_{l=1}^{L} h_l \hat{s}_{n-l}\right)^2 \quad (13)$$

where m indicates a parallel transition index and $e_m$ indicates a symbol corresponding to a parallel transition. Unlike the case of a hard decision equalizer, multiple branch metrics exist between the states $\Omega_{n-1}$ and $\Omega_n$, one for each of the parallel transitions. The previous symbols for each trellis are denoted by $\hat{s}_{n-1}$, and are determined by survivor processing per Viterbi Algorithm. The cumulative metric for each of the states after the $(n-1)^{th}$ transition is given by, $\Gamma(n-1, \Omega_{n-1})$, where $\Omega_{n-1}$ is the state index.

Two forward recursive partially collapsed metrics are defined as:

$$\Lambda^+(n, \Omega_{n-1}, \Omega_{n-1+L}) = \quad (14)$$

$$\Gamma(n-1+L, \Omega_{n-1}) + \min_{\{m_i, \Omega_{n-1+i}\}_+} \left[\sum_{i=0}^{L-1} \gamma(n+i, \Omega_{n-1+i}, \Omega_{n+i}, m_i)\right]$$

$$\Lambda^-(n, \Omega_{n-1}, \Omega_{n-1+L}) =$$

$$\Gamma(n-1+L, \Omega_{n-1}) + \min_{\{m_i, \Omega_{n-1+i}\}_-} \left[\sum_{i=0}^{L-1} \gamma(n+i, \Omega_{n-1+i}, \Omega_{n+i}, m_i)\right].$$

The quantities $\Lambda^+$ and $\Lambda^{-1}$ represent the cumulative metric of starting from state $\Omega_{n-1}$ and ending in state $\Omega_{n-1+L}$ in L transitions such that the $n^{th}$ bit was +1 and −1 respectively. The minimum is evaluated between the interim states $\Omega_{n-1+i}$ and the parallel transition indices $m_i$. For $\Lambda^+$ only those $m_0$ which correspond to a symbol such that the bit=+1 are considered, and for $\Lambda^-$ only those $m_0$ which correspond to symbol such that the bit=−1 are considered. In the case of 8-PSK modulation, this calculation is performed for each of the three bits since the choices of $m_0$ for $\Lambda^+$ and $\Lambda^-$ are different for each of the three bits. The minimum in equation (14) is jointly calculated over all the possible transitions and parallel transitions from $\Omega_{n-1}$ to $\Omega_{n-1+L}$ in L symbol transitions.

Since the a-priori probability is given by the exponential of the cumulative metric, the probability of the bit corresponding to the $n^{th}$ transition being equal to +1 and −1 are given by the following equations, respectively.

$$p^+(n) = \sum_{\Omega_{n-1},\Omega_{n-1+L}} e^{-\Lambda^+(n,\Omega_{n-1},\Omega_{n-1+L})} \quad (15)$$

$$p^-(n) = \sum_{\Omega_{n-1},\Omega_{n-1+L}} e^{-\Lambda^-(n,\Omega_{n-1},\Omega_{n-1+L})}$$

The summation in (15) is over $\Omega_{n-1}$ to $\Omega_{n-1+L}$, which are the internals states of the Viterbi algorithm before the (n−1)th and (n−1+L)th symbol transitions, respectively. For example, in implementations having four possible states {0, 1, 2 and 3}, the summation in (15) would be over 4×4 possible combinations {0,0}, {0,1}, {0,2}, . . . {3,1}, {3,2} and {3,3}.

The soft log-likelihood ratio of the $n^{th}$ bit is given by:

$$LLR(n) = \ln\frac{p^+(n)}{p^-(n)} = \ln\left[\sum e^{[-\Lambda^+(n,\Omega_{n-1},\Omega_{n-1+L})]}\right] - \ln\left[\sum e^{[-\Lambda^-(n,\Omega_{n-1},\Omega_{n-1+L})]}\right]. \quad (16)$$

Equations (15) and (16) are calculated separately for each of the bits associated with a given symbol. The following equation $$ln(e^{-x}+e^{-y}) = -\min\{x,y\}+ln\{1+e^{-|y-x|}\} \quad (17)$$

provides an approximation of $-\min\{x,y\}$ if $x<<y$ or $y<<x$. Equation (17) can be used to simplify the calculation of the a-priori probabilities. Using the approximation, the soft log-likelihood values for the $n^{th}$ bit can be approximated by the following.

$$LLR(n) = \min_{\Omega_{n-1},\Omega_{n-1+L}} \{\Lambda^-(n,\Omega_{n-1},\Omega_{n-1+L})\} - \min_{\Omega_{n-1},\Omega_{n-1+L}} \{\Lambda^+(n,\Omega_{n-1},\Omega_{n-1+L})\} \quad (18)$$

After the soft log-likelihood value for the $n^{th}$ symbol has been determined, the partially collapsed metrics $\Lambda^+$ and $\Lambda^-$ are collapsed to give the completely collapsed metric $\Gamma$. The relationship to do so can be developed from the definition of the cumulative metric which is related to the a-priori probability of the system being in a particular state after a particular number of symbol transitions.

$$Pr\{\Omega_n\} = \quad (19)$$

$$e^{-\Gamma(n,\Omega_n)} = \sum_{\Omega_{n-L}} e^{[-\Lambda^+(n-L+1,\Omega_{n-L},\Omega_n)]} + \sum_{\Omega_{n-L}} e^{[-\Lambda^-(n-L+1,\Omega_{n-L},\Omega_n)]}$$

$$\Gamma(n,\Omega_n) = -\ln\left[\sum_{\Omega_{n-L}} e^{[-\Lambda^+(n-L+1,\Omega_{n-L},\Omega_n)]} + \sum_{\Omega_{n-L}} e^{[-\Lambda^-(n-L+1,\Omega_{n-L},\Omega_n)]}\right]$$

The approximation in equation (17) can be used to simplify equation (19) into the following form.

$$\Gamma(n,\Omega_n) = \min\left(\min_{\Omega_{n-L}}(\Lambda^+(n,\Omega_{n-L},\Omega_n)), \min_{\Omega_{n-L}}(\Lambda^-(n,\Omega_{n-L},\Omega_n))\right) \quad (20)$$

The above-described process is iterated to calculate the soft likelihood for each of the symbols.

An SBVE receiver 44 determines the soft log-likelihood values based on the output of the pre-filter 40 in the above-described way. A de-interleaving component 46 de-interleaves the output of the SBVE receiver 44. A Viterbi decoder 48 generates hard decisions based on the de-interleaved, soft log-likelihood values. The Viterbi decoder 48 outputs a received information bit sequence 50 that ideally is the same as the transmitted information bit sequence 20.

Figure 3:
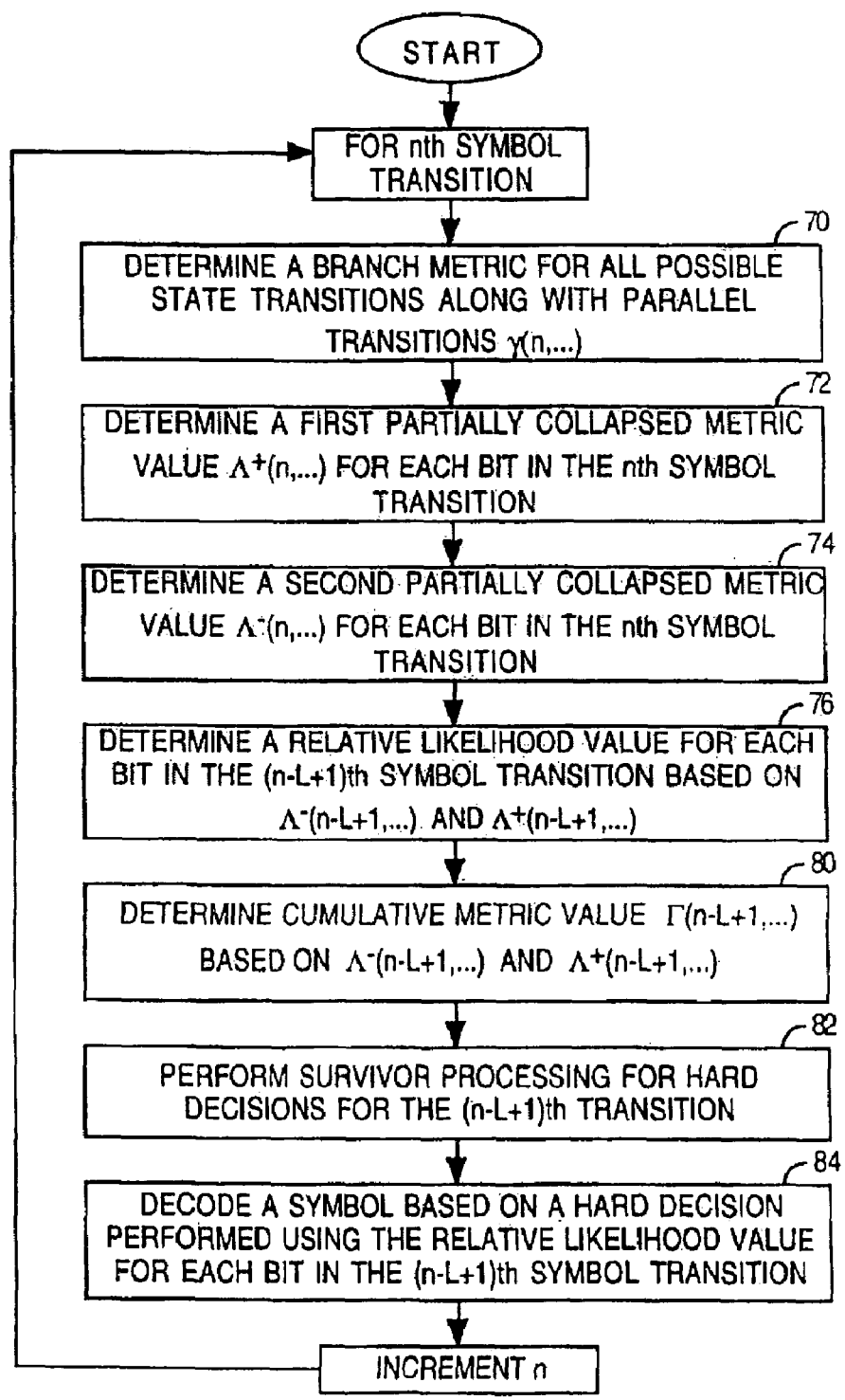
FIG. 3 is a flow chart of an embodiment of a method to calculate the soft likelihood values.

FIG. 3 is a flow chart of summarizing an embodiment of a method to calculate the soft likelihood values by the SBVE receiver 44. The blocks in FIG. 3, which are illustrated for an $n^{th}$ symbol transition, are performed for each symbol transition.

As indicated by block 70, the method comprises calculating or otherwise determining a branch metric for all possible state transitions along with the parallel transitions γ(n, . . . ).

As indicated by block 72, the method comprises calculating or otherwise determining a first partially collapsed metric value $\Lambda^+(n, ...)$ for each bit in an nth symbol transition. Each first partially collapsed metric value is a cumulative metric of starting in a first state and ending in a second state in L transitions with the respective bit in the nth symbol transition being a first value.

As indicated by block 74, the method comprises calculating or otherwise determining a second partially collapsed metric value $\Lambda^-(n, ...)$ for each bit in an nth symbol transition. Each second partially collapsed metric value is a cumulative metric of starting in the first state and ending in the second state in L transitions with the respective bit in the nth symbol transition being a second value. The second value differs from the first value (e.g. the second value may be −1 and the first value may be +1).

The acts indicated by blocks 72 and 74, which can be performed in any order, act to calculate partially collapsed metrics $\Lambda^+(n, ...)$ and $\Lambda^-(n, ...)$ based on the current and previous branch metrics and the cumulative metric $\Gamma(n-L, ...)$.

As indicated by block 76, the method comprises calculating or otherwise determining a relative likelihood value, for each bit in the (n−L+1)th symbol transition, based on its respective first partially collapsed metric value and its respective second partially collapsed metric value. Each relative likelihood value may comprise a LLR, in which case the LLR for the (n−L+1)th bit is calculated based on the partially collapsed metrics $\Lambda^+(n-L+1, ...)$ and $\Lambda^-(n-L+1, ...)$. Thus, the LLR calculation is not performed for the current symbol (i.e. the nth symbol) but rather for the current-L+1 symbol due to channel lag. In other words, the LLR computation lags the calculation of partial and completely collapsed metrics.

The acts indicated by blocks 72, 74 and 76 are repeated for all the bits associated with a symbol (3 for 8-PSK). This acts to separately calculate LLR values for each of the bits associated with a symbol transition.

As indicated by block 80, the method comprises calculating or otherwise determining another cumulative metric value based on the first and second partially collapsed metric values. The cumulative metric $\Gamma(n-L+1, ...)$ is determined based on the partially collapsed metrics $\Lambda^+(n-L+1, ...)$ and $\Lambda^-(n-L+1, ...)$.

As indicated by block 82, the method comprises an act of performing survivor processing for the hard decisions for the $(n-L+1)^{th}$ transition.

As indicated by block 84, the method comprises decoding a symbol based on a hard decision performed using the relative likelihood values for each bit in a symbol transition. With reference to FIG. 1, once the SBVE receiver 44 has determined soft LLRs for all the bits, the Viterbi decoder 48 can make hard decisions based on the sign of the LLRs. When compared to a traditional Viterbi Algorithm, acts 72, 74 and 76 are the additional processing performed by the SBVE receiver 44 to generate the soft log-likelihood values.

Simulations were performed to quantify the performance benefit of the SBVE over symbol-by-symbol soft decoding. The simulations were run using the EDGE signal transmission format for 8-PSK with MCS7 (coding rate 0.76). The transmitted signal is passed through a typical urban channel with 3 km/hr mobile speed (TU3) at 1900 MHz to simulate the effect of multipath fading. A WGN noise is added to the faded signal to generate the signal at the receiver. An initial CIR is estimated using the training sequence code (TSC) embedded within each GSM burst (one time slot), which is used to calculate the response of the pre-filter 40. The received signal is passed through the pre-filter 40 maximizing the partial energies of the leading equalizer taps. The SBVE algorithm is used to obtain the soft log-likelihood based on the filtered signal. The sign of the LLR is used to determine the channel bits (hard decision). The channel bits determined at the receiver 12 are compared with the channel bits at the transmitter 10 to generate the channel or modem bit error rate (BER).

Soft log-likelihood values over four consecutive GSM bursts (1 RLC Block=4 bursts) are used by the Viterbi decoder 48 to generate hard decisions of the original information bits. The estimated information bits 50 are compared with the information bits 20 used by the transmitter 10 to generate the block error rate (BLER).

Figure 4:
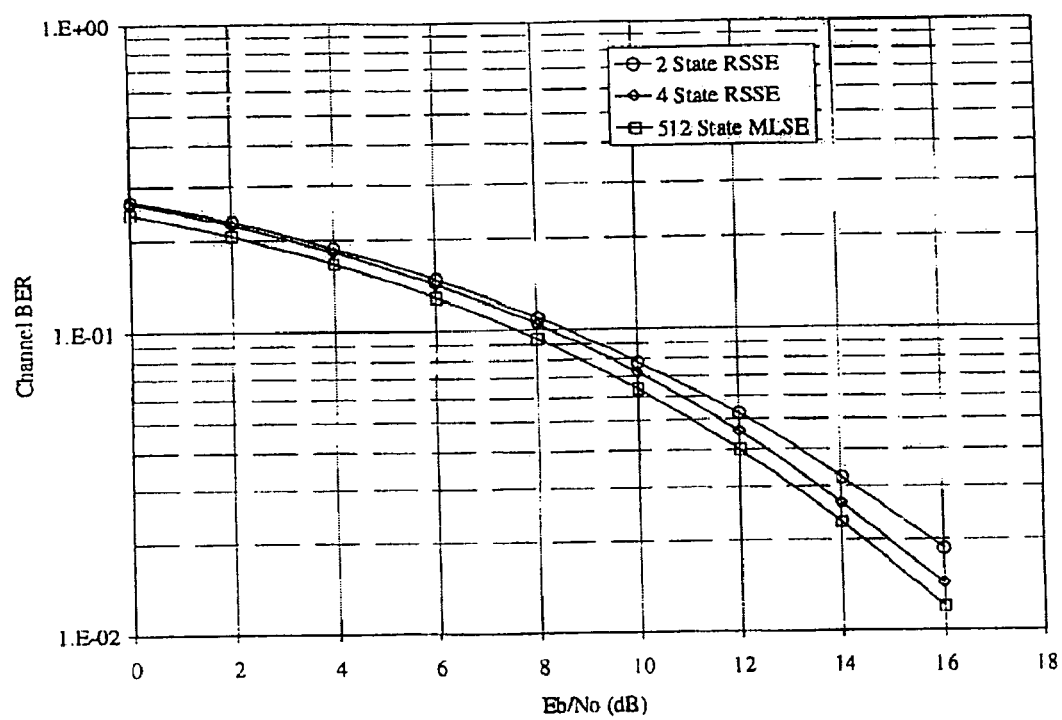
FIG. 4 illustrates graphs of a simulated channel bit error rate of a 4-state RSSE and a 512 state MLSE for 8-PSK modulation.

FIG. 4 illustrates graphs of a simulated channel BER of a 4-state RSSE and a 512 state MLSE for 8-PSK modulation. The set partitioning chosen for the 4-state RSSE is shown in FIG. 2, and the memory order of the equalizer is set to 2, which results in a total of $2^2$ states within the equalizer. The 2-state RSSE uses the same set partitioning and has a memory order of 1.

The performance of the reduced state equalizers, particularly the 4-state RSSE is remarkably close to the performance of the 512-state MLSE. A difference exists in a range of 1 dB to 0.5 dB depending on the targeted BER value. Since most systems are designed to achieve a channel BER of 10% to 5%, performance of the 4-state RSSE is acceptable considering that the amount of processing required is orders of magnitude less.

Figure 5:
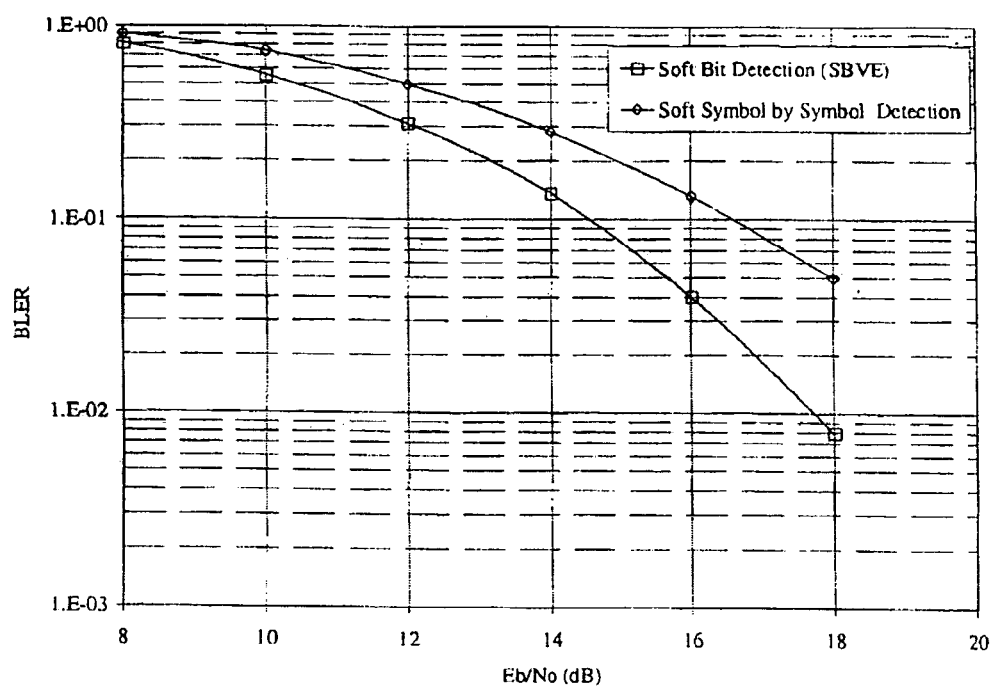
FIG. 5 illustrates graphs of simulated block error rate performance of a soft bit Viterbi equalizer (SBVE) and a soft symbol decision RSSE.

FIG. 5 illustrates graphs of simulated BLER performance of both the SBVE and a soft symbol decision RSSE. The soft symbol decision RSSE with the given set partitioning works much like a SDVE, where the likelihood ratio is defined as the ratio of the probabilities of the most likely symbol belonging to either of the two sets. The most likely symbol is chosen from each of the two sets based on minimum metric, which provides the hard decision. The sign of the LLR is determined by the hard decision, and the magnitude of the LLR is determined by the ratio of the probabilities. Since all the three bits belonging to a single symbol are assigned the same magnitude of the LLR, this is in essence symbol-by-symbol soft decoding.

The BLER is calculated for MCS7 using both of these equalizers and the difference in performance is in the range of 1.5 dB to 2.5 dB depending on the targeted BLER value. A difference of 2 dB translates to an increase in the average timeslot throughput from 17.9 kbps to 27.7 kbps for an EDGE network deployed with 1/1 reuse and frequency hopping with 20% fractional load. Thus the overall throughput and performance of the system increases by using the soft bit decoding as described herein compared to a symbol-by-symbol soft decoding.

A new algorithm capable of bit-by-bit soft decoding of a 8-PSK signal for EDGE has been introduced herein and characterized in terms of its performance. The algorithm allows an RSSE to develop reliable soft log-likelihood values on a bit-by-bit basis with relatively less computational overhead. The algorithm enables the implementation of an EDGE receiver that is capable of multi-slot operation. Based on simulation results, the performance of a receiver based on the algorithm is approximately 2 dB better than a receiver based on a symbol-by-symbol soft decoding for MCS7. In a real implementation the performance difference could be different depending on many factors including the modulation and coding scheme. Although presented in the framework of 8-PSK modulation, the SBVE algorithm can be extended to other modulation schemes without loss of generality.

The herein-disclosed transmitter and receiver components and acts which they perform can be implemented in mobile radio telephones (e.g. cellular telephones) and/or mobile radio telephone base stations. For example, the herein-disclosed transmitter and receiver components and acts which they perform can be implemented by one or more integrated circuits for mobile telephones (e.g. a mobile telephone chip set).

Acts performed by the herein-disclosed components can be directed by respective computer program code embodied in a computer-readable form on a computer-readable medium. A computer processor responds to the computer program code to perform the acts.

It will be apparent to those skilled in the art that the disclosed embodiments may be modified in numerous ways and may assume many embodiments other than the forms specifically set out and described herein.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of decoding data transmitted via a communication channel, the method comprising:

determining a first partially collapsed metric value for each bit in a symbol transition, each first partially collapsed metric value being a cumulative metric of starting in a first state and ending in a second state in L transitions with the respective bit in the symbol transition being a first value, the first state and the second state being internal states of a Viterbi algorithm, wherein the first partially collapsed metric value is equal to the cumulative metric value for each of the states plus first minimum sum of branch metric values;

determining a second partially collapsed metric value for each bit in the symbol transition, each second partially collapsed metric value being a cumulative metric of starting in the first state and ending in the second state in L transitions with the respective bit in the symbol transition being a second value, the second value differing from the first value;

for each bit in the symbol transition, determining a relative likelihood value based on its respective first partially collapsed metric value and its respective second partially collapsed metric value; and decoding at least one symbol based on a hard decision performed using the relative likelihood value for each bit in the symbol transition.

2. The method of claim 1 wherein each relative likelihood value is a log likelihood ratio based on its respective first partially collapsed metric value and its respective second partially collapsed metric value.

3. The method of claim 1 wherein the first minimum sum of branch metric values are over all state transitions and parallel transitions in L symbol transitions in which the respective bit in the symbol transition is the first value.

4. The method of claim 3 wherein determining the second partially collapsed metric value is based on the cumulative metric value and second minimum sum of branch metric values over all state transitions and parallel transitions in L symbol transitions in which the respective bit in the symbol transition is the second value.

5. The method of claim 1 further comprising:
determining another cumulative metric value based on the first and second partially collapsed metric values.

6. A receiver to decode data transmitted via a communication channel, the receiver comprising:
a soft bit equalizer to:
determine a first partially collapsed metric value for each bit in a symbol transition, each first partially collapsed metric value being a cumulative metric of starting in a first state and ending in a second state in L transitions with the respective bit in the symbol transition being a first value, the first state and the second state being internal states of a Viterbi algorithm, wherein the first partially collapsed metric value is equal to the cumulative metric value for each of the states plus first minimum sum of branch metric values;
determine a second partially collapsed metric value for each bit in the symbol transition, each second partially collapsed metric value being a cumulative metric of starting in the first state and ending in the second state in L transitions with the respective bit in the symbol transition being a second value, the second value differing from the first value; and
for each bit in the symbol transition, determine a relative likelihood value based on its respective first partially collapsed metric value and its respective second partially collapsed metric value; and
a decoder responsive to the soft bit equalizer, the decoder to decode at least one symbol based on a hard decision performed using the relative likelihood value for each bit in the symbol transition.

7. The receiver of claim 6 wherein each relative likelihood value is a log likelihood ratio based on its respective first partially collapsed metric value and its respective second partially collapsed metric value.

8. The receiver of claim 6 wherein the first minimum sum of branch metric values are over all state transitions and parallel transitions in L symbol transitions in which the respective bit in the symbol transition is the first value.

9. The receiver of claim 8 wherein the soft bit equalizer is to determine the second partially collapsed metric value based on the cumulative metric value and a second minimum sum of branch metric values over all state transitions and parallel transitions in L symbol transitions in which the respective bit in the symbol transition is the second value.

10. The receiver of claim 6 further comprising:
determining another cumulative metric value based on the first and second partially collapsed metric values.

11. A computer-readable medium having computer readable program code to cause a computer processor to perform acts comprising:
determining a first partially collapsed metric value for each bit in a symbol transition, each first partially collapsed metric value being a cumulative metric of starting in a first state and ending in a second state in L transitions with the respective bit in the symbol transition being a first value, the first state and the second state being internal states of a Viterbi algorithm, wherein the first partially collapsed metric value is equal to the cumulative metric value for each of the states plus first minimum sum of branch metric values;
determining a second partially collapsed metric value for each bit in the symbol transition, each second partially collapsed metric value being a cumulative metric of starting in the first state and ending in the second state in L transitions with the respective bit in the symbol transition being a second value, the second value differing from the first value;
for each bit in the symbol transition, determining a relative likelihood value based on its respective first partially collapsed metric value and its respective second partially collapsed metric value; and
decoding at least one symbol based on a hard decision performed using the relative likelihood value for each bit in the symbol transition.

12. The computer-readable medium of claim 11 wherein each relative likelihood value is a log likelihood ratio based on its respective first partially collapsed metric value and its respective second partially collapsed metric value.

13. The computer-readable medium of claim 11 wherein the first minimum sum of branch metric values are over all state transitions and parallel transitions in L symbol transitions in which the respective bit in the symbol transition is the first value.

14. The computer-readable medium of claim 13 wherein determining the second partially collapsed metric value is based on the cumulative metric value and a second minimum sum of branch metric values over all state transitions and parallel transitions in L symbol transitions in which the respective bit in the symbol transition is the second value.

15. The computer-readable medium of claim 11 wherein the acts further comprise:
determining another cumulative metric value based on the first and second partially collapsed metric values.

* * * * *